*(12)* United States Patent
Sutani et al.

(10) Patent No.: US 7,518,110 B2
(45) Date of Patent: Apr. 14, 2009

(54) PATTERN MEASURING METHOD AND PATTERN MEASURING DEVICE

(75) Inventors: Takumichi Sutani, Hitachinaka (JP); Ryoichi Matsuoka, Hitachinaka (JP); Hidetoshi Morokuma, Hitachinaka (JP); Hitoshi Komuro, Hitachinaka (JP); Akiyuki Sugiyama, Hitachinaka (JP)

(73) Assignee: Hitachi High-Technologies Corporation, Tokyo (JP)

( * ) Notice: Subject to any disclaimer, the term of this patent is extended or adjusted under 35 U.S.C. 154(b) by 181 days.

(21) Appl. No.: 11/359,374

(22) Filed: Feb. 23, 2006

(65) Prior Publication Data

US 2006/0193508 A1    Aug. 31, 2006

(30) Foreign Application Priority Data

Feb. 25, 2005    (JP)    ............................. 2005-049923

(51) Int. Cl.
*G01B 9/00* (2006.01)
(52) U.S. Cl. ........................................ 250/311; 250/307
(58) Field of Classification Search ................. 250/307, 250/311; 356/237.2; 382/145, 143, 144
See application file for complete search history.

(56) References Cited

U.S. PATENT DOCUMENTS 6,285,783 B1 *  9/2001  Isomura et al. ............. 382/147
6,868,175 B1 *  3/2005  Yamamoto et al. .......... 382/145
7,062,396 B2 *  6/2006  Ogawa ........................ 702/85
7,228,522 B2 *  6/2007  Beale .......................... 716/19
7,428,328 B2 *  9/2008  Jee et al. ..................... 382/145
2002/0015518 A1 *  2/2002  Matsuoka ................... 382/145
2004/0081350 A1 *  4/2004  Kitamura et al. ............ 382/149
2005/0146714 A1 *  7/2005  Kitamura et al. ......... 356/237.2
2005/0184234 A1 *  8/2005  Nakayama .................. 250/311

FOREIGN PATENT DOCUMENTS

| JP | 2000-292362 | 10/2000 |
| JP | 2001-110862 | 4/2001 |
| JP | 2002-32737 | 1/2002 |
| JP | 2002-328015 | 11/2002 |
| JP | 2004-31709 | 1/2004 |

* cited by examiner

*Primary Examiner*—Nikita Wells
*Assistant Examiner*—Johnnie L Smith, II
(74) *Attorney, Agent, or Firm*—Antonelli, Terry, Stout & Kraus, LLP.

(57) ABSTRACT

A pattern measuring method and device are provided which set a reference position for a measuring point to be measured by a scanning electron microscope and the like, based on position information of a reference pattern on an image acquired from the scanning electron microscope and based on a positional relation, detected by using design data, between the measuring point and the reference pattern formed at a position isolated from the measuring point.

9 Claims, 11 Drawing Sheets

DESIGN DATA    SEM IMAGE

PATTERN MEASURING METHOD AND PATTERN MEASURING DEVICE

BACKGROUND OF THE INVENTION

The present invention relates to a pattern measuring method, a pattern measuring device and a program, and more particularly to a method, device and program for measuring a pattern in an acquired image.

It has been known to measure a pattern on a semiconductor integrated circuit by using CAD (Computer Aided Design) data. Design data such as CAD data represents intended, ideal geometries of semiconductor devices, so comparison between the CAD data and an actually formed pattern can evaluate a semiconductor manufacturing process. In U.S. Pat. No. 6,868,175B1 and U.S. 2002/0015518A1 is disclosed a technology which detects an amount of deformation of a pattern with respect to design data by detecting an edge of a pattern to be inspected and an edge of a reference pattern and comparing these detected edges.

As described above, the actually formed pattern exhibits a shape different from that of the design data because of manufacturing process effects. Many different shapes of patterns are formed on a semiconductor wafer. There is no definite criterion for position alignment between the design data and the actual pattern and thus it is not possible to measure, according to some reference, a degree to which the pattern being inspected is deviated from an ideal pattern represented by the design data or how much the pattern is deformed.

SUMMARY OF THE INVENTION

To solve the problem described above, a reference position for a measuring point to be measured by a SEM (scanning electron microscope) and the like is set based on position information of a reference pattern on an image acquired from the SEM and based on a positional relation, detected by using design data, between the measuring point and the reference pattern formed at a position isolated from the measuring point.

In this construction, since the position of the reference pattern is detected from the image acquired from the SEM and, with this position as a reference, the reference position for measurement is set using the design data, it is possible to evaluate to what extent an actual pattern is deviated or deformed from an ideal pattern location or pattern shape, by using the design data and the position information based on a SEM image.

Other objects, features and advantages of the invention will become apparent from the following description of the embodiments of the invention taken in conjunction with the accompanying drawings.

BRIEF DESCRIPTION OF THE DRAWINGS

FIG. 6 shows where on a chip of a wafer the design data corresponds to.

DESCRIPTION OF THE EMBODIMENTS

Figure 1:
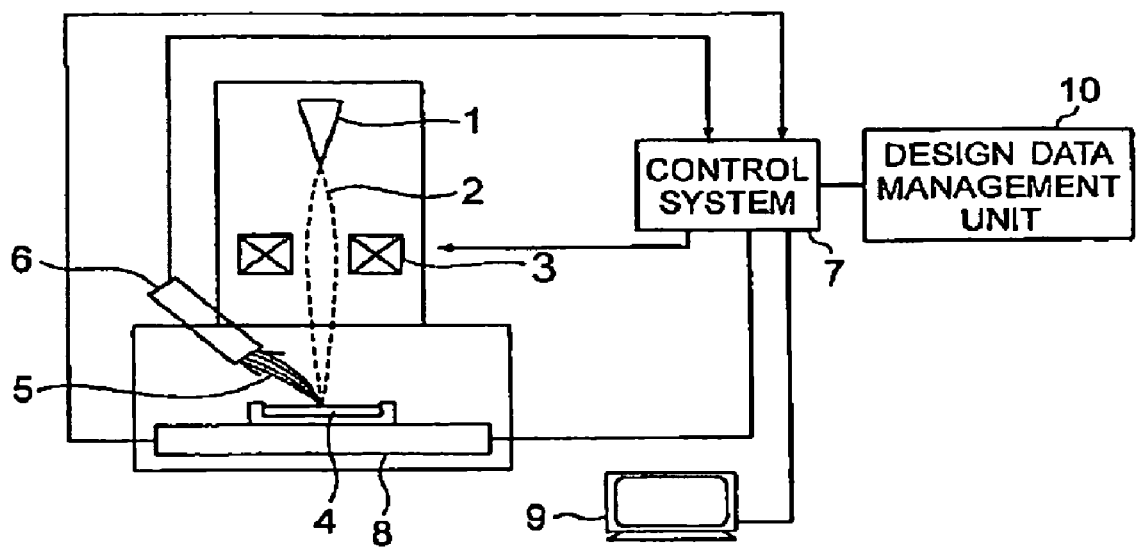
FIG. 1 illustrates an outline of a SEM (scanning electron microscope).

An outline of a SEM (scanning electron microscope) will be explained in the following. An electrooptical system of FIG. 1 focuses a charged particle beam (electron beam) 2 emitted from a charged particle source (electron gun) 1—that releases electrons, or charged particles—by a lens 3 onto a specimen 4 and scans the specimen in a desired sequence. Secondary particles (e.g., secondary electrons) 5 produced at the surface of the specimen 4 as a result of application of the electron beam are detected by a secondary particle detection system 6, from which they are supplied as image data to a control system 7 (control processor) with an image calculation control function. The specimen 4 can be moved in all three-dimensional directions by an X-Y-Z stage 8. The control system 7 performs control on the charged particle source (electron gun) 1, lens 3, secondary particle detection system 6, X-Y-Z stage 8 and also on a display 9.

In this example, the electron beam 2 is scanned over the specimen 4 two-dimensionally (in X-Y directions) by a scanning coil not shown. A signal detected by a secondary electron detector in the secondary particle detection system 6 is amplified by a signal amplifier in the control system 7 and then transferred to an image memory and shown as a specimen image on the display 9. The secondary signal detector may be one that detects secondary electrons or reflected electrons or one that detects light or X rays.

An address signal corresponding to a memory position on the image memory is generated in the control system 7 or in a separate computer, converted into an analog signal and supplied to the scanning coil. When, for example, the image memory is 512×512 pixels, an address signal in the X direction is a repetitive digital signal ranging from 0 to 512 and an address signal in the Y direction is a repetitive digital signal ranging from 0 to 512 that is incremented by 1 when the X-direction address signal reaches a value of 512. These address signals are converted into analog signals.

Since the address of the image memory matches an address of a deflection signal for scanning the electron beam, the image memory is recorded with a two-dimensional image of a beam deflection area in which the scanning coil deflects the electron beam. The signal in the image memory can be chronologically read out in sequence by a read address generation circuit synchronized with a read clock. The signal read out based on the address is converted into an analog signal that becomes a luminance modulation signal of the display 9.

The control system 7 is provided with an input device not shown, by which an image retrieve condition (scan speed and total number of imaged pages), a viewing field correction method and an image output and storage can be specified.

The device of this example has a function to form a line profile based on detected secondary electrons or reflected electrons. The line profile is formed according to an amount of electrons detected when scanning a primary electron beam one-dimensionally or two-dimensionally, or according to brightness information of the specimen image. The line profile thus obtained is used, for example, to measure dimensions of a pattern formed on a semiconductor wafer.

While in FIG. 1 the control system 7 has been described to be integral with the SEM or configured in an equivalent state, it is not limited to these conditions. For example, processing explained in the following may be performed by a control processor provided separately from the SEM. In that case, it is necessary to provide a transmission medium by which to transfer a detection signal detected by the secondary signal detector to the control processor or transfer a signal from the control processor to the lens or deflector of the SEM, and also an input/output terminal to input or output signals transferred via the transmission medium.

The device of this example also has a function which stores, as a recipe in advance, conditions (such as measuring locations and optical conditions of the SEM) for observing a plurality of points on a semiconductor wafer and performs measurements and observations according to a content of the recipe.

It is also possible to register a program for the processing explained in the following with a storage medium and execute the program by the control processor that supplies necessary signals to the SEM. That is, an example explained below also covers a program or program product that can be employed in a charged particle beam device such as a SEM with an image processor.

Further, the control system 7 includes a design data management unit 10 which stores design data of a pattern formed on the semiconductor wafer and converts it into data required for the control of the SEM. The design data management unit 10 has a function to generate a recipe for controlling the SEM based on the design data of the semiconductor pattern entered from an input device not shown. The design data management unit 10 also has a function to rewrite the recipe according to a signal transferred from the control system 7. Although, in this example, the design data management unit 10 is described to be separate from the control system 7, it may be otherwise. For example, the control system 7 and the design data management unit 10 may be integrated with each other.

This example takes a wafer in the semiconductor product manufacturing process as the specimen 4. A resist pattern formed on the wafer in the lithography process was used. For comparison with the resist pattern, semiconductor circuit design data (CAD data) that constitutes a base for the pattern was used. The semiconductor circuit design data used here represents an ideal geometry for the final semiconductor circuit pattern. Although in the following description, the subject to be inspected is taken to be a semiconductor wafer, other subjects may be used as long as there is a correspondence between the design data and a subject to be evaluated. The circuit design data may be of any kind if software that displays the circuit design data can display its format and handle it as graphical data.

Embodiment

Conventionally, in a SEM an observer manually specifies measuring points. Thus, the locations of the measuring points need to be found on the wafer but it is very difficult to determine the specified locations on the wafer. After the measuring points are specified, the observer must set conditions necessary to prepare a recipe for the SEM, such as addressing points and autofocus points, for each measuring point. Therefore, the precision of this manual setting necessarily depends on the experience of the observer.

Further, since there is a limiting condition that the preparation of the dimension measuring recipe requires a SEM and a wafer, an efficient work has not been possible. If, for example, a pattern is chosen as an addressing point, whether that choice is appropriate or not cannot be known until it is actually matched to the pattern on the wafer. By repeating such a trial and error the dimension measuring recipe for the SEM is made. A prolonged time taken by the recipe preparation means a reduction in the efficiency. Another factor that should be pointed out for the bad efficiency of the conventional method is that the SEM must be used even during the generation of the dimension measuring recipe, during which time other measurements cannot be made.

As the design rule of semiconductor devices is getting smaller in recent years, the use of an exposure wavelength shorter than a pattern critical dimension (CD) necessarily increases an optical proximity effect and an optical proximity correction technology has a growing significance. The optical proximity effect is a phenomenon in which even patterns with the same reticle CD may have different pattern CDs depending on the environment in which the patterns are placed.

The environment referred to here is, for example, a pattern pitch. Under the condition that a pattern CD on a mask and a pattern CD on a wafer are equal in a dense environment, an isolated pattern in a coarse environment become narrower in CD. This phenomenon is called the optical proximity effect and a technology to compensate for this effect is the optical proximity correction. Increasing the reticle CD of the isolated pattern can adjust the pattern CD on a wafer to be equal to that of the dense pattern.

Such a simple optical proximity correction can be evaluated by measuring the pattern CD. In recent years, an evaluation method has been proposed which measures a pattern shape in order to make an optical proximity correction with higher precision. One such example involves measuring a pattern position with respect to a reference.

Figure 2:
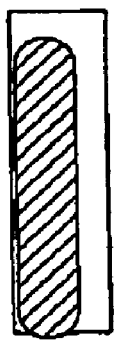
FIG. 2 shows circuit design data and a pattern superimposed together.

FIG. 2 represents a case where design data and a pattern on the wafer can be superimposed precisely. In this case, not only can the two dimensions be measured but their positional relation can also be measured. Measuring the positions can provide more information than can the pattern CD. So, the position information can be expected to contribute to more precise optical proximity correction. Since there is no such reference on the wafer, the pattern positions have been difficult to measure. But this measurement can be made by overlapping the circuit design data over the wafer pattern in an image acquired by the SEM.

This example is briefly explained as follows by using a flow chart of FIG. 3. First, using the circuit design data, evaluation points to be inspected are determined. For each of the evaluation points, a recipe for making measurements by SEM is generated. According to the recipe thus prepared, an image of the evaluation points on the wafer to be inspected is acquired by using the SEM. The acquired image is compared to the circuit design data for evaluation. While in this example, the comparison is made with the circuit design data, other reference patterns may be used as long as they can be compared. For example, comparison may be made between a simulated image obtained from the design data and an image acquired by the SEM.

Figure 3:
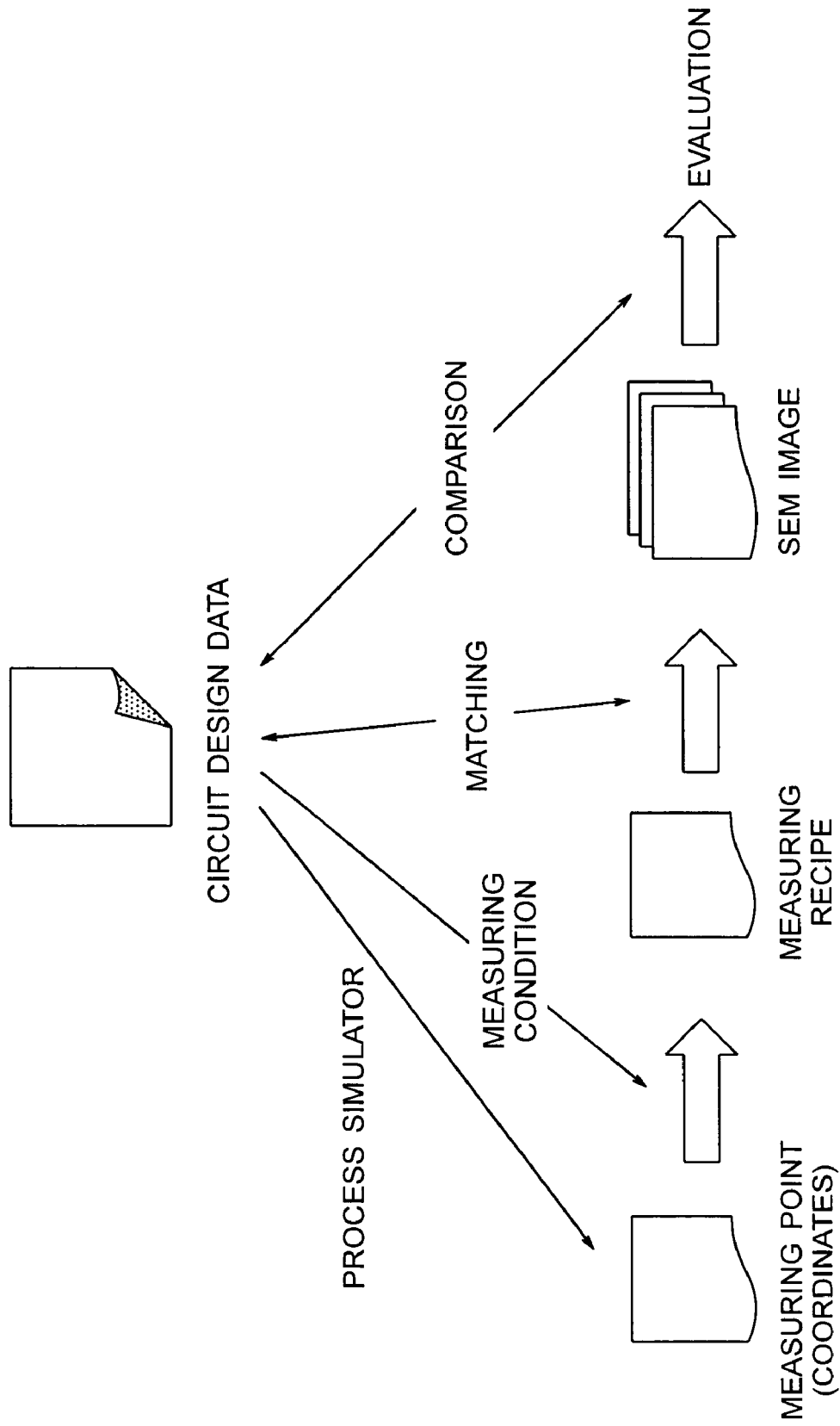
FIG. 3 is a flow chart from a generation of a dimension measuring recipe to an evaluation based mainly on the circuit design data.

Individual steps in the flow chart of FIG. 3 are explained below one by one. In this example, design data used for evaluation is a simulated circuit design pattern with a minimum line width of 90 nm which is generated in GDSII format. In a step of determining evaluation points in this simulated circuit design pattern, a lithography simulator is used to inspect a wafer following the lithography process.

When inspecting a wafer following other processes, inspection points may be determined by using an associated simulator. For example, in a pattern following an etching process an etching simulator may be used to determine inspection points. In this example, a lithography simulator of Sigma-C make, Solid-C, was used. This simulator can directly handle GDSII format data of the circuit design pattern and, by using process conditions of the lithography process from the circuit design pattern, it is possible to specify in what pattern the circuit design pattern will be obtained following the lithography process.

A condition used for simulation is: a projection optical system reduction ratio of 1/4, an exposure wavelength of 193 nm, a Numerical Aperture (NA) of 0.73, a coherence factor σ of 0.75, a ring shield factor ε of 0.67, and a set exposure energy of 28 mJ/cm$^2$. This condition is the same as used for wafers manufactured later. A design rule checker was used to select, from a pattern geometry obtained by the simulation, those locations that are considered likely to cause defects. This is a tool that automatically detects locations in the pattern formed by the simulation where the dimensions will become short. In this example, a design rule checker incorporated in Calibre of Mentor Graphics was used. The design rule checker detects as hazardous points those locations where lines are formed to less than 80 nm in width or to more than 100 nm. In this example, only the line width are checked for uncertain locations, it is also possible to extract uncertain locations in other respects. The detected uncertain points were output as coordinates on the circuit design pattern.

That is, for a design rule of 90 nm, lower and upper threshold are set at 80 nm and 100 nm, respectively, and those locations where the line width is equal to or in excess of these thresholds are extracted as hazardous points and their coordinates with respect to the design data are output. In this example, the extracted information is shown on a display device or display 9 in the design data management unit 10. This arrangement facilitates a decision making as to where on a semiconductor wafer formed with a plurality of different patterns the measuring points (evaluation points) should be set. It is also possible to provide an input device such as a pointing device in the design data management unit 10 or control system 7 and to select, from among the uncertain points, desired locations as the measuring points. By making arrangements so that the above selection causes the recipe to be automatically rewritten, the operator can specify, from among the uncertain points, the locations to be measured based on his or her experience, realizing both the proper selection of uncertain points and the more efficient evaluation in terms of time. An arrangement may also be made which involves automatically recording the detected uncertain points in the recipe as locations to be measured and later deleting unnecessary measuring locations from them.

Next, a recipe is generated for the SEM to inspect the output coordinates. To measure the evaluation points by the SEM, it is necessary to change, according to the environment in which the evaluation points are placed, the set conditions including wafer alignment points for correcting not only the coordinates of evaluation points but also stage coordinates and chip coordinates, addressing points leading to the wafer alignment points used to make position correction step by step, and locations where autofocus and autostigma are performed.

In this example, areas for the addressing points and autofocus and autostigma points are automatically determined from the design data.

Further, since the design data can be handled as an addressing template, the generation of the dimension measuring recipe has become possible without a wafer on which the dimension measurement is to be performed. The settings of other than the above coordinates (magnification factor on the addressing points and measuring points, acceleration voltage, specimen current, electrooptical system condition and contrast condition) were specified as the measurement conditions by the observer. This is because these settings cannot be determined from the circuit design data but are the information that should be determined by the observer.

The recipe for the SEM involves first performing the wafer alignment to correct the coordinates between chips formed on the wafers. This allows coordinates on the chips to be used in the SEM. Next, images of individual hazardous points are acquired. In this invention the addressing is performed in steps. The first addressing corrects errors in the stage precision of the SEM and the next addressing corrects the position of the patterns to be measured. Since the guaranteed range of a stage stopping accuracy in the SEM used in this invention is 4 μm, the magnification at the first addressing point was fixed at 20K, which sets one side of the viewing field (square) to 6.75 μm. It is of course possible to perform the addressing with a smaller magnification, i.e., with a viewing field measuring more than 4 μm on one side. In this example, the magnification was set to the one at the first addressing point.

As described above, the first addressing point depends on the stage stopping accuracy of the SEM used. The second addressing point is selected within the same viewing field as the final measuring point. An example case will be explained as follows in which an image is stored using 2048×2048 pixels. If individual pixel areas in the SEM image are considered equal, the 2048×2048 pixels produce a SEM image in the viewing field four times the side, and 16 times the area, of the viewing field with 512×512 pixels. The 2048×2048-pixel area includes not only the measuring point but also the second addressing point. The final image to be acquired is a 512× 512-pixel image with one side measuring 900 nm. Other magnification factors may be used as long as they produce a desired resolving power.

In this example, it is already known in advance that this magnification factor produces a desired resolving power, so this magnification factor was used. Under this condition, the second addressing point is a square area which includes a 900-nm square and which measures 4×900 nm, or 3600 nm, on each side. Because the number of pixels in each side of the acquired image is quadrupled, the side of the image area is also quadrupled. If an image of this square area is acquired and if the pattern acquired by SEM can be matched to the circuit design data at appropriate locations/areas in this square area, then the finally obtained image lies at a position matching the design data.

Figure 4:
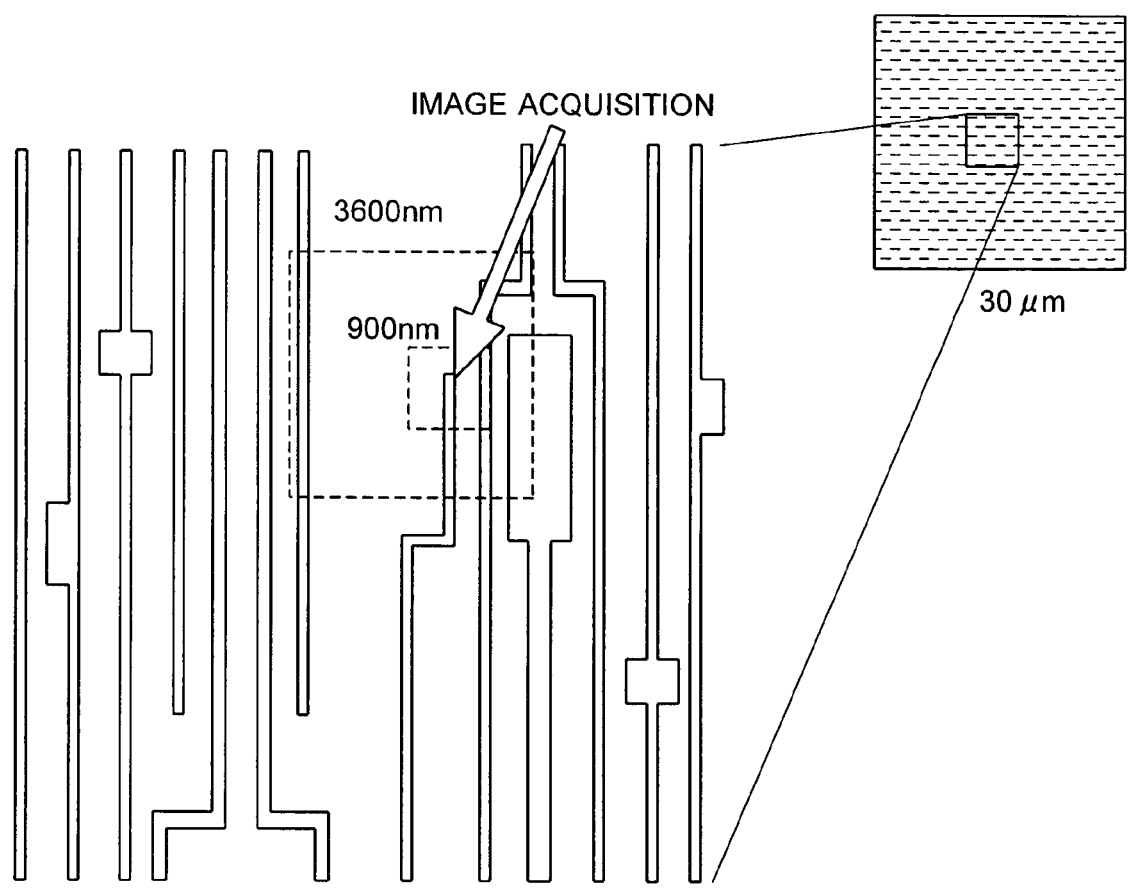
FIG. 4 shows an example of an image acquisition point.

FIG. 4 schematically shows hazardous locations output from the lithography simulator and the design rule checker, i.e., a 900-nm square area with a point from which an image should be acquired located at the center, and a 3600-nm square area including the 900-nm square area. At this stage, however, the second addressing point is not yet determined, so the process for specifying the second addressing point will be described later.

Figure 5:
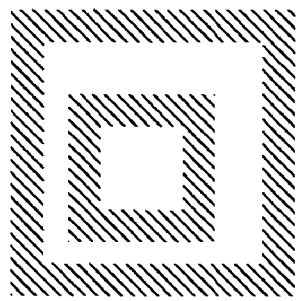
FIG. 5 shows an example of a box-in-box pattern.

For the wafer alignment point that is set at the initial stage, an alignment precision correction mark located on the chip is used. In manufacturing a semiconductor device, a device layer is laid over an immediately preceding layer to form an intended device. The alignment precision correction mark is used to check if the overlapping precision is within a range of specification and, in the processes following the overlapping step, the overlapping precision is verified by a dedicated device. Representative of this mark is a pattern called a box in box, such as shown in FIG. 5. Two squares are each on separate layers and a deviation between the center coordinates of the two boxes is detected as an alignment accuracy.

Since this pattern is put at a predetermined position on each device layer, its coordinates can be specified from the design data. As a template image for alignment, design data was used. Other patterns than the box-in-box pattern may be used to perform the wafer alignment.

Figure 6:
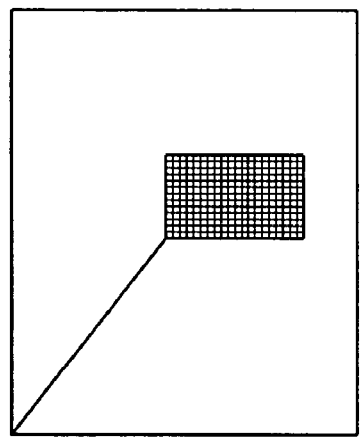

Next, the image acquired by the SEM and the design data must be matched in position. Generally, there is no particular rules regarding a coordinate origin for the design data. So, unless a correlation value between them is given, there is no association between the coordinates of the design data and the SEM image. In FIG. 6 a hatched area is assumed to represent the design data and an outer frame a chip of a wafer. It is very difficult to handle the circuit design data for the same area as the wafer chip area because of the data size. In this example, the circuit design data was prepared for only a limited area in which a point to be measured exists. This arrangement made the data easy to handle.

Figure 7:
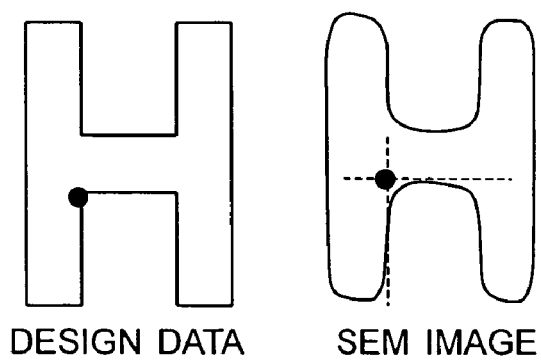
FIG. 7 shows an example pattern used to determine a distance between the design data and a position on the wafer.

In order to match the positions of the design data and the SEM image, coordinates of a particular position are determined in each coordinate system and their coordinates are made equal. In this example, an H-shaped character pattern of an appropriate size is arranged on the design data as shown in FIG. 7, and the coordinates in the two systems of the same location are used. The SEM pattern, unlike the design data, is curved at the corners, so two line segments are extended and an intersecting point is taken to be the corner.

Figure 17:
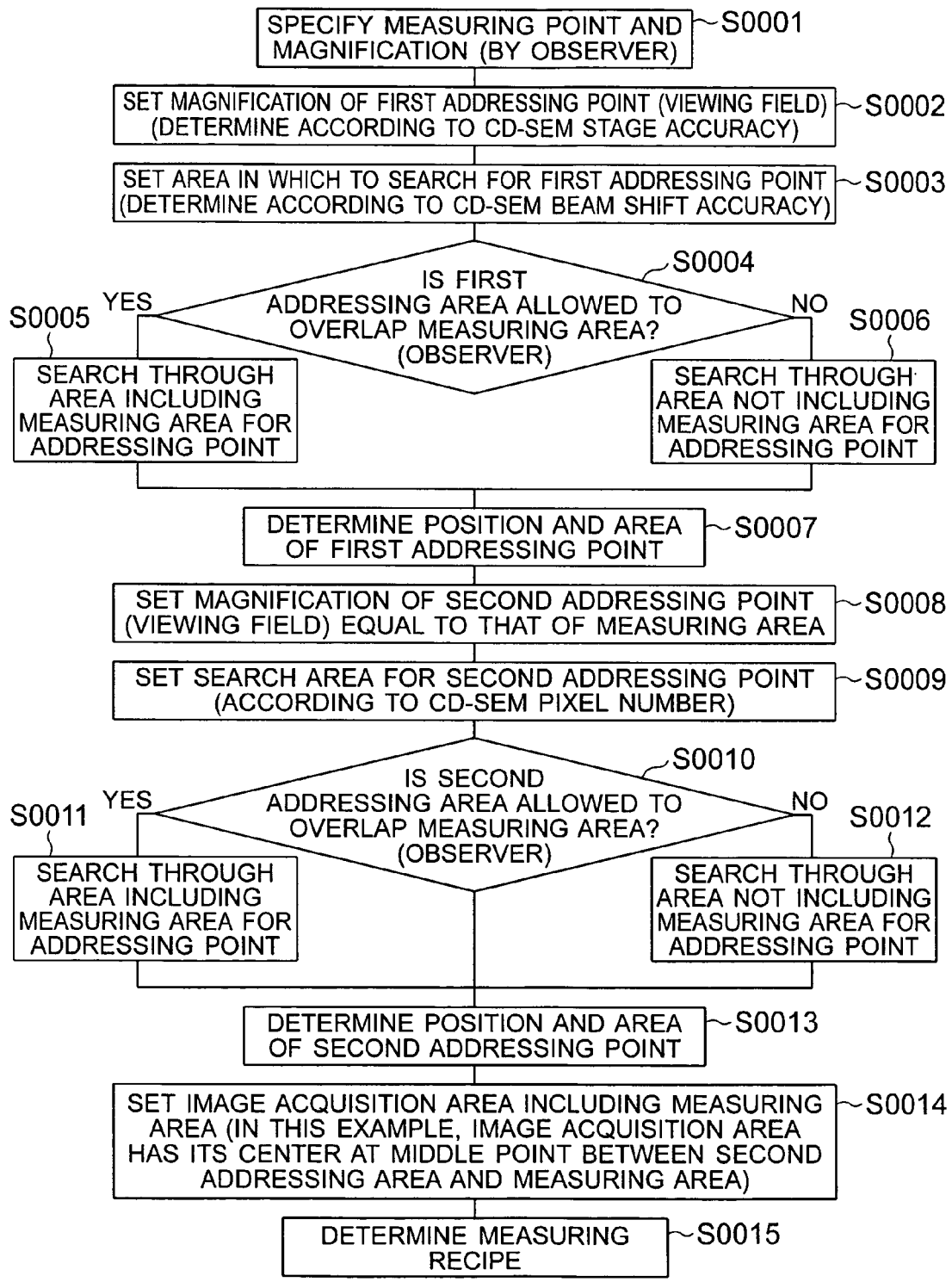
FIG. 17 is a flow chart showing a detailed sequence of information setting in a SEM recipe.

Under the above conditions, detailed information on the SEM recipe is determined. FIG. 17 is a flow chart showing details of an information setting sequence. First, a final measuring point and its magnification factor are specified (S0001). Although this example first specifies the measuring point and the magnification factor, others may be specified.

Next, to determine a point for correcting the position of the SEM image, i.e., an addressing point, a candidate area is determined. More specifically, the candidate area needs only to be within a range in which the viewing field can be changed by moving the electron beam path. If the candidate area is an area extending 15 μm up/down and left/right from the evaluation point as the center, the addressing point is determined within this range. In other words, the addressing point needs to be set in an area 30 μm on each side.

Figure 8:
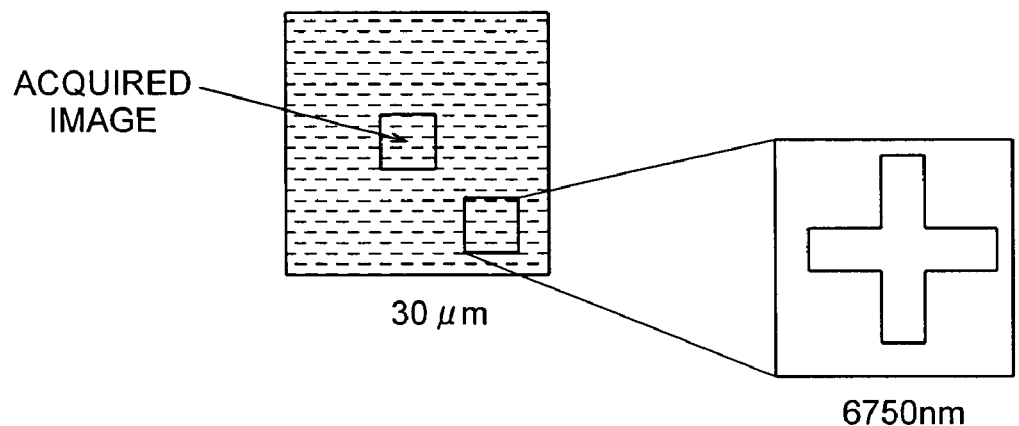
FIG. 8 is a diagram showing a positional relation between a first addressing point and an image acquisition point.

Even if the SEM stage stopping accuracy is lowest, when the stage fails to stop within the viewing field, the SEM image cannot be matched and its position not corrected. So, the magnification factor and the viewing field at the first addressing point depend on the stage stopping accuracy of the SEM. The size of the addressing template is determined within a 30 μm square area. In this example, the size of the template image of the addressing point is determined by limiting the viewing field to a square area 6750 nm in one side within the 30 μm square area and a location suited for addressing is searched as shown in FIG. 8 (S0002) (S0003).

In this example, since the side of the viewing field was 6750 nm that gave a wider area than the stage stopping accuracy. A wider viewing area will pose no problem at all in terms of system because the template image falls in this viewing field if there is an error in the movement of the SEM stage. In this example, a square area 6750 nm in one side was automatically determined as a template in the square viewing field 30 μm in one side by applying a normalization correlation method.

While in this example an area suited for addressing was automatically determined by using a method described in "Iwanami Course: Multimedia Information 5, Information Processing on Image and Space, p. 56". The addressing area was determined by excluding an area of the final image to be acquired.

In this example, a cross pattern as shown in the figure was determined as the first addressing point. Next, the autofocus point and the autostigma point were automatically determined from the design data in a way similar to that of the first addressing point. The determination of the autofocus point and the auto stigmapoint differs from that of the first addressing point in that their appropriate areas are determined in the same viewing field as the final image acquisition magnification factor (in this invention, a 900-nm square area).

Next, a decision is made as to whether the area in which the first addressing point was set is allowed to overlap the measuring area (S0004). If there is a pattern in the addressing area, the autofocus can be executed in that area. The operator makes a decision as to whether the addressing point should be searched in an area including the measuring area (S0005) or in an area not including the measuring area (S0006). In the last step, the operator determines the position/area of the first addressing point (S0007).

Next, a location for the second addressing point is determined. In a 3600-nm square area encompassing the final, required image area of 900-nm square, the addressing point needs to be determined by the method described above in an area excluding the image acquisition point. It is noted, however, that at the first addressing point one pixel of the SEM image is about 13-nm square area and that an addressing error necessarily occurs within the range of this pixel size.

Figure 9:
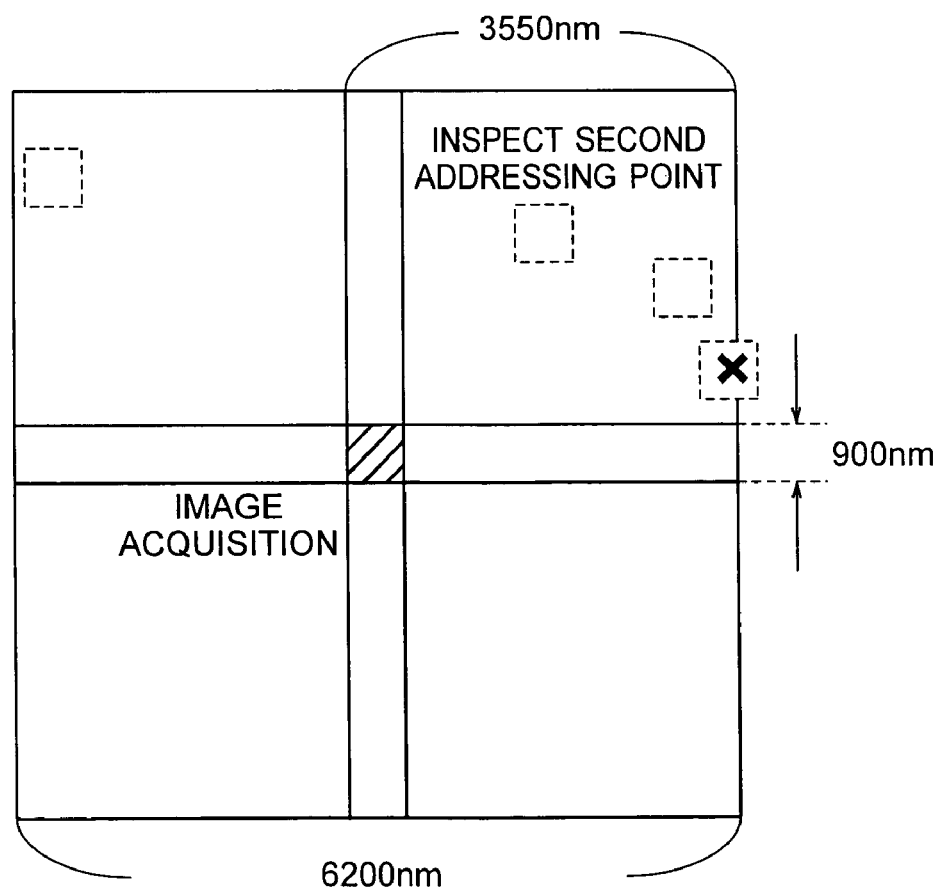
FIG. 9 is a diagram showing how a second addressing point is searched.

To prevent a possible positional deviation at the second addressing point due to this error, a location for the second addressing point is searched in a 3550-nm square area, more than 15 nm inside the 3600-nm square area. Since the final acquired image needs only to be included in the 3550-nm square area, the second addressing point is searched in a square area measuring 3550 nm×2−900 nm=6200 nm in one side with the image acquisition point at the center as shown in FIG. 9. In this example, the magnification factor (viewing field) at the second addressing point was set equal to that of the measuring area (S0008). In generating a dimension measuring recipe, before determining the position and area of the second addressing point (S0013), the search area for the second addressing point is set (S0009) and the operator decides whether the second addressing area is allowed to overlap the measuring area (S0010), as in the case of the first addressing point. The operator decides whether the addressing point should be searched in an area including the measuring area (S0011) or in an area not including the measuring area (S0012), and then determines the position/area of the second addressing point.

Figure 10:
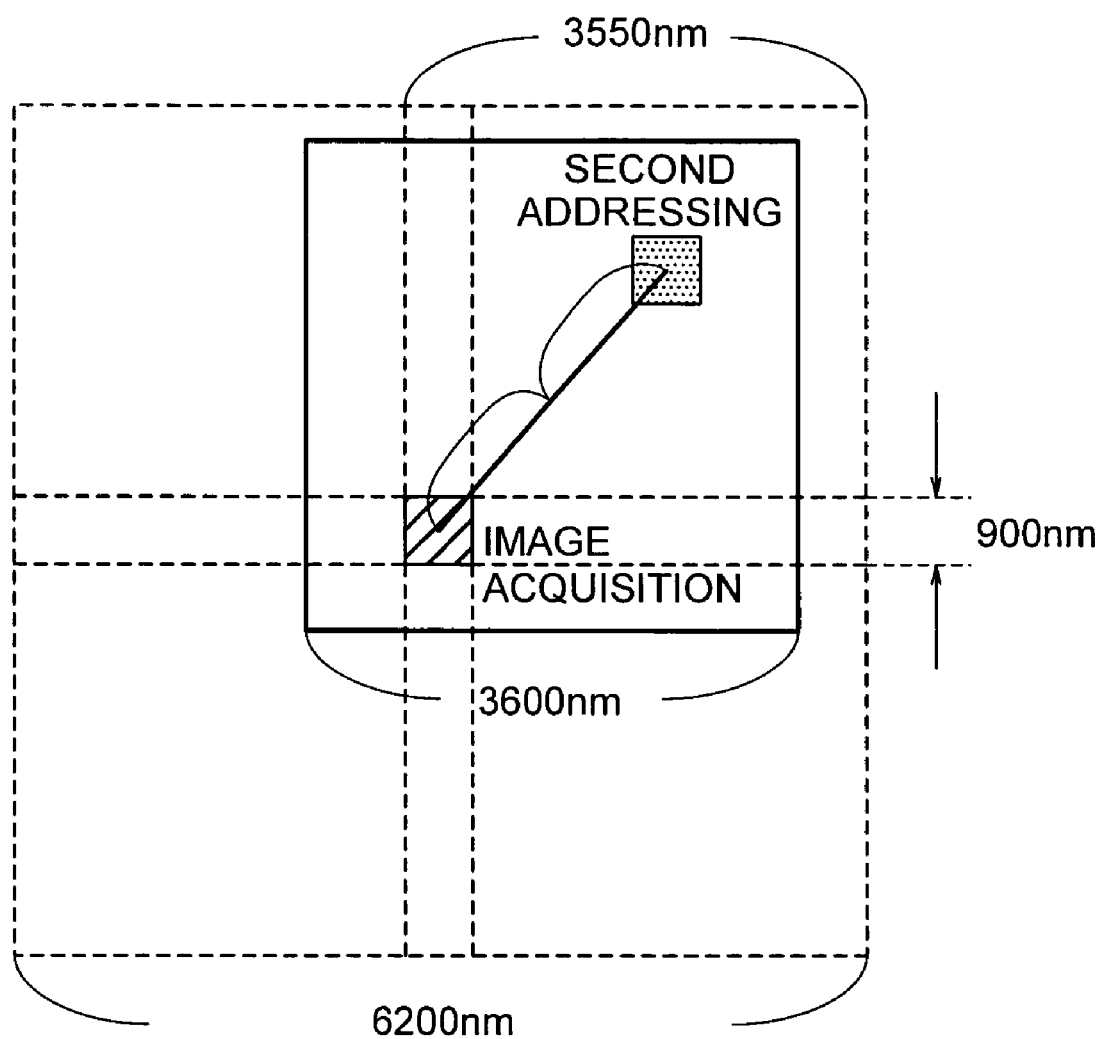
FIG. 10 is a diagram showing a positional relation between the searched second addressing point and the image acquisition point.

If, as a result of the search, the second addressing point is determined as shown in FIG. 10, a middle point on a line segment connecting the centers of the image acquisition point and the second addressing point is taken as the center of the final, acquired image (S0014). Since the final image acquisition area is a 3600-nm square area, this area includes the second addressing point and is an area of the final image acquired by the SEM. Further, addressing is performed in this area to extract only a 900-nm square area and overlap the design data and the SEM image, thereby producing a completely aligned, overlapped image.

Figure 11:
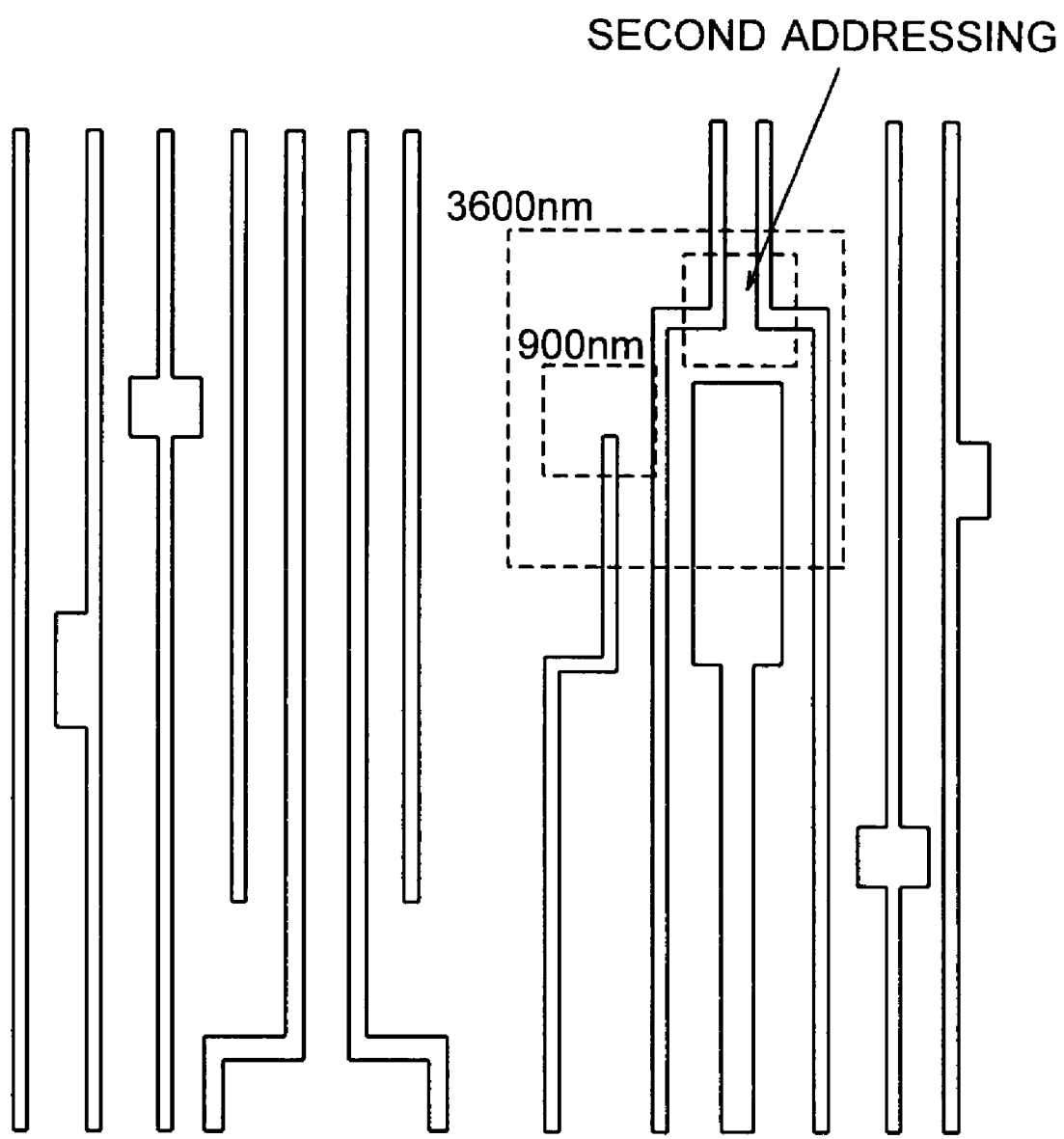
FIG. 11 shows a detailed example on the circuit design data of FIG. 10.

A recipe for acquiring the SEM image is generated in the manner described above for each hazardous point output from the process simulator. The result of automatically determining the second addressing point in the 6200-nm square area with the image acquisition point at the center is shown in FIG. 11. That is, this area is the most characteristic shape and therefore suited for the addressing point. From the second addressing point and the image acquisition point, the final, acquired image area was determined.

A pattern is formed on a wafer, for example, in a process described below. First, a coat type reflection prevention film is spin-coated on the wafer to a thickness of about 60 nm. This is further spin-coated with a chemically amplified, positive resist film about 200 nm thick. This wafer is masked with a photomask formed from the design data used in this example and exposed under the same condition as used in the process simulator: a projection optical system reduction ratio of 1/4, an exposure wavelength of 193 nm, an NA of 0.73, a coherence factor $\sigma$ of 0.75, a ring shield factor $\epsilon$ of 0.67, and set exposure energy of 28 mJ/cm$^2$. After exposure, the wafer is subjected to a post exposure baking (PEB) at 100° C. for about 90 seconds and then immersed in an alkaline developing liquid of 0.21 N for about 60 seconds for development to form a transferred pattern on the wafer.

An image of hazardous locations on the wafer is acquired by the SEM. The recipe used for the acquisition is generated from the design data by the method described above. Since the recipe is based on the design data, if the design data is not matched to the position of the image acquired by the SEM, the addressing point does not function and thus the final, required image cannot be acquired. In this example, a method described in JP-A-2002-328015 was used as the matching method.

Figure 12:
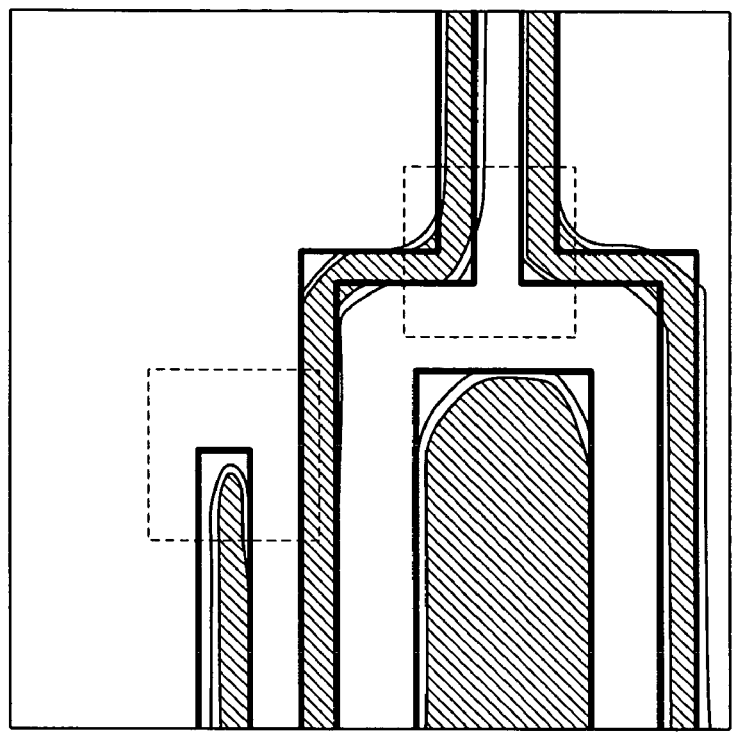
FIG. 12 shows an example in which positions of a SEM image and the circuit design data are aligned at the second addressing point.

This method makes it possible to use the design data as the template for the SEM, thus acquiring a SEM image of hazardous points. The result of matching the acquired SEM image to the design data in the 3600-nm square area including the second addressing point and the hazardous point is schematically shown in FIG. 12. This shows a SEM image in an image area including the second addressing point and the design data corresponding in position to the SEM image and overlapped on it. They are matched in the viewing field.

In this example, the second addressing point isolated from the hazardous points is taken as a reference pattern, and a reference position for measurement (e.g., line portion of a line pattern at left in FIG. 12) is set based on the information of reference pattern position on the image and the design data for a portion including the reference pattern and the hazardous points (points to be measured). As shown in FIG. 12, the second addressing point and the position on the SEM image corresponding to the second addressing point are matched, overlapping the SEM image and the design data. This overlap allows the reference position for measurement to be set by using the actual position information obtained from the actual SEM image and an ideal position relation between the reference pattern obtained from the design data and the measured location.

Particularly in this example, since the measured location is a line pattern extending vertically, there is a problem that the reference position for measurement in the vertical direction in the figure is difficult to set precisely. However, by taking a pattern extending in both vertical and horizontal directions in the figure as the second addressing point, a position alignment precision in both vertical and horizontal directions in the figure can be secured, allowing the measurement reference position in the vertical direction of the figure to be located with high precision. This method of setting the measurement reference proves very effective, for example, in evaluating by how much the front end of the line pattern has shrunk with respect to the design data.

An example dimension measuring method using the measurement reference position set by the above method will be explained.

Figure 13:
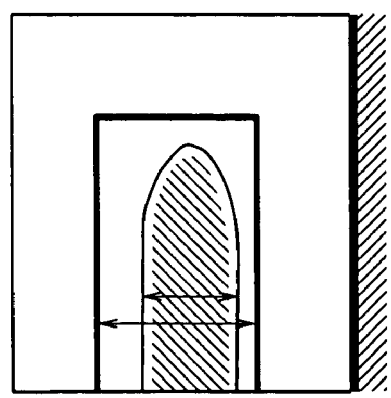
FIG. 13 shows an example image acquisition point cut off FIG. 12.

FIG. 13 shows only an image acquisition area extracted from the acquired SEM image and design data overlapped on the viewing field image. Although in this viewing field, the design data and SEM image seem deviated in position, their positional relation is correct because the viewing field is cut off a larger area that has been matched with the design data.

A SEM image obtained from this figure is evaluated with respect to the design data. To make an evaluation in terms of a line width detected by the design rule checker, the line width of the SEM image in this viewing field is first measured.

In the case of FIG. 13, it can be evaluated how much the actually formed pattern is deviated from the design data as a reference.

Figure 14:
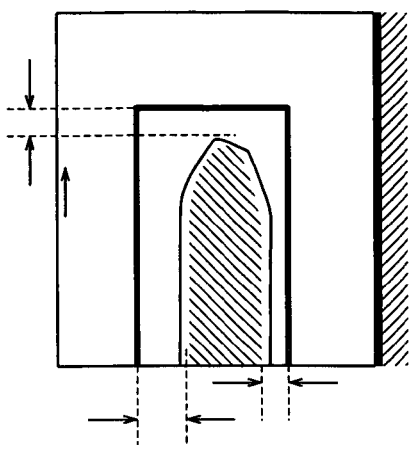
FIG. 14 shows an example in which a measuring point is determined from an image obtained from FIG. 13.

In the case of FIG. 14, a difference between the SEM image and the design data is taken to be an evaluation value. Comparison with the design data allows for an evaluation in other respects than the line width. A distance between a line segment of the design data and an edge segment of the SEM image can be taken as an evaluation item. In the case of FIG. 14, it is possible to evaluate how much the pattern has shrunk in the vertical direction or a degree of lateral deviation with respect to the design data as a reference. In the case of a contact hole pattern, though not shown, a new contact hole evaluation method can be proposed which makes comparison between the reference positions and the upper and bottom parts of the contact hole. In this case, the reference positions for both the upper and bottom parts of the contact hole may be made settable.

Further, data thus obtained may be displayed as a wafer map. An example method for displaying the data as a wafer map is described in JP-A-2001-110862 (U.S. Pat. No. 6,765, 204).

These distances are the values that can only be obtained if the SEM image and the associated design data are overlapped correctly. Additional overlap of the design data corresponding to the next process of the device pattern allows for an evaluation in other respects.

Figure 15:
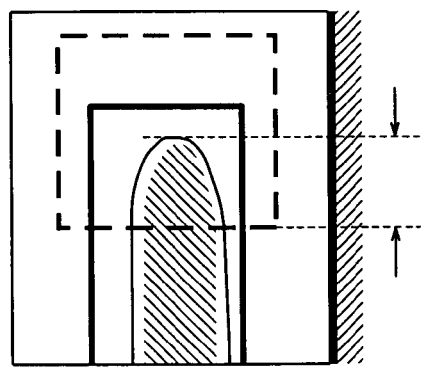
FIG. 15 shows an example in which a distance is measured between an imaginary line segment not present on a wafer and a pattern.

Square design data shown dashed in FIG. 15 represents an ideal position of a pattern formed in the next process of the semiconductor device fabrication. Since there is no overlay error for each piece of design data, a degree of superimposition with the data shown in a dashed line may be used as an evaluation reference. In this example, a distance was measured between the dashed line design data and the pattern end. Comparison between the SEM image pattern acquired in this manner and the design data allowed a new measurement value to be calculated. Parameters required for measurement were not determined from the circuit design data but determined optimally from a SEM image after it was acquired. In this example, a linear approximation method was used for the measurement based on the SEM image. A threshold in this method was set at 50% of a maximum intensity of secondary electron signal.

Figure 16A:
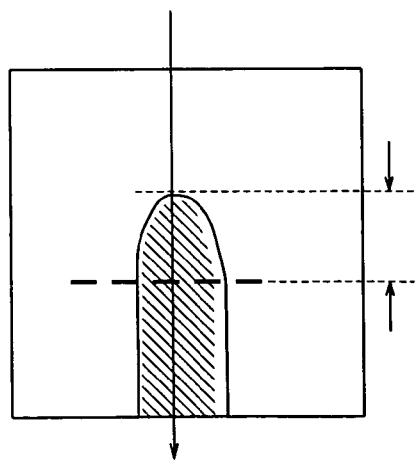
FIG. 16A and FIG. 16B show a location of measurement performed in FIG. 15 and an intensity of a secondary electron signal at that location, respectively.
Figure 16B:
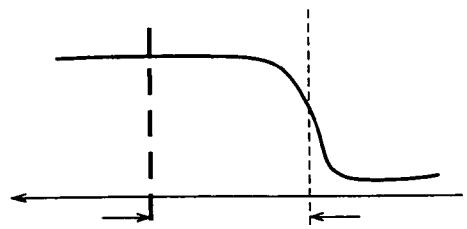

FIG. 16A shows a measuring point in a SEM image. A secondary electron signal was detected over an area from the top to the bottom of the figure. FIG. 16B shows an intensity of a secondary electron signal. The position of the right side of the figure is determined by the linear approximation method with its threshold set at 50%. The position of the left side of the figure was already determined by the matching between the circuit design data and the SEM image, so the dimension could be measured from both of their values. Measurements were able to be made at other locations by the similar method.

Figure 18:
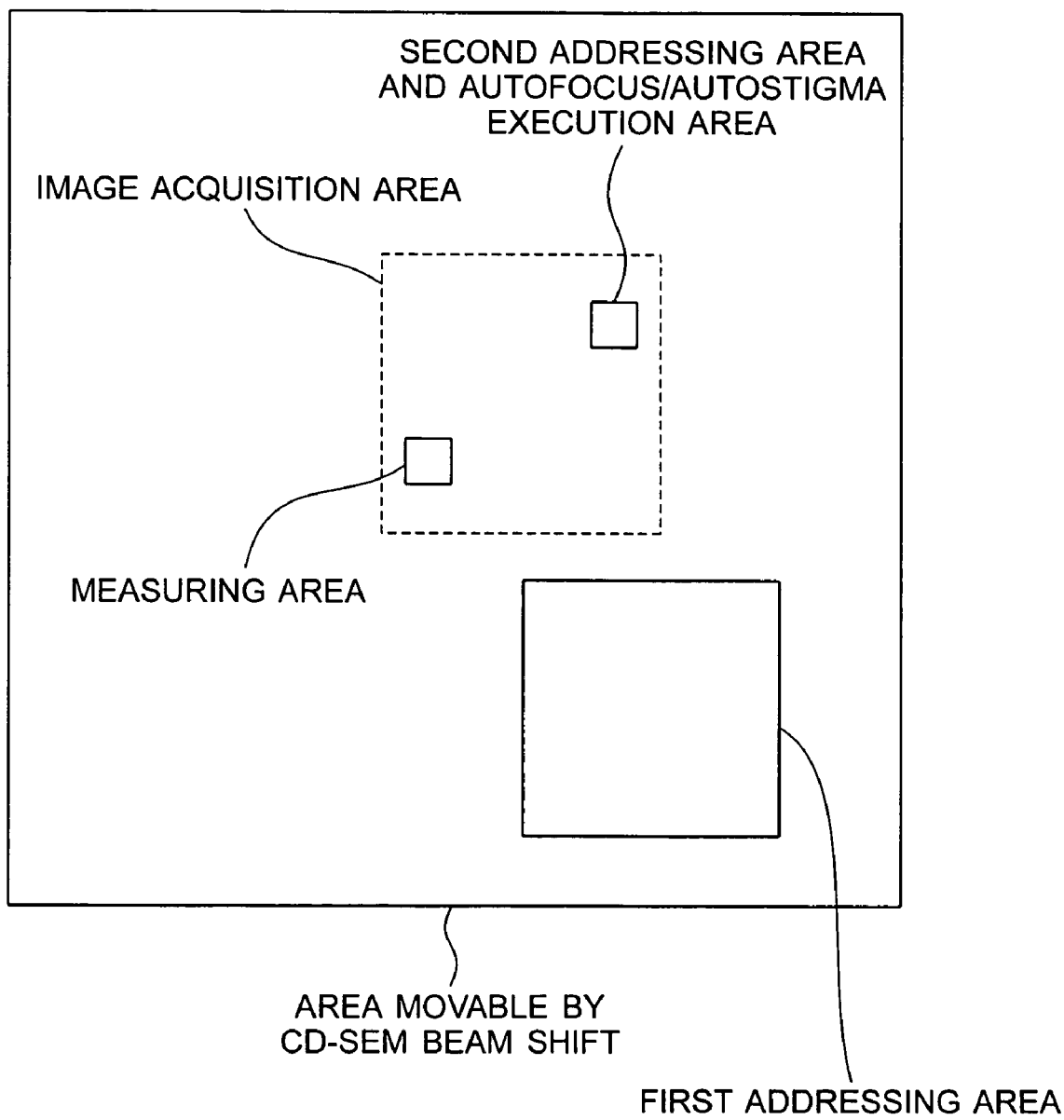
FIG. 18 is a conceptual diagram of a generated recipe.

FIG. 18 is a conceptual diagram showing a generated SEM measurement recipe. Such a conceptual diagram is shown on a display during the recipe generation process so that a person making the recipe (operator) can decide whether the image acquisition area is appropriate or not. In this example, areas to be set in the recipe generation process are shown on the circuit design data to make it possible to ascertain whether there is an overlapping in the region where the electron beam is scanned. Further, displaying these areas in different colors for discrimination and indicating their roles allows them to be easily identified.

For example, AP1/AF indicates that the area of interest is a first addressing area in which the autofocus is to be executed. If the electron beam scanning is performed for addressing and autofocus before the measurement is made, the measured value may differ from that when such an electron beam scanning is not performed. Therefore, the above indication is effective.

It should be further understood by those skilled in the art that although the foregoing description has been made on embodiments of the invention, the invention is not limited thereto and various changes and modifications may be made without departing from the spirit of the invention and the scope of the appended claims.

The invention claimed is:

1. A pattern measuring method for acquiring an image of a pattern on a specimen and measuring the pattern on the image, the pattern measuring method comprising the steps of:
   acquiring an image including a measurement pattern and a reference pattern arranged at a position isolated from the measurement pattern on the specimen;
   executing a pattern matching algorithm which matches the reference pattern on the image with design data of the specimen, as the reference pattern on the image and a part of the design data corresponding to the reference pattern are superimposed; and
   measuring a difference between the measurement pattern and a part of the design data corresponding to the measurement pattern based on the matched image.

2. A pattern measuring method according to claim 1, wherein the image is acquired so that the reference pattern and the measuring point are arranged on the same image.

3. A pattern measuring method according to claim 2, wherein a center of the image is located at a middle point between the reference pattern and the measuring point.

4. A pattern measuring method according to claim 2, wherein the image is an image acquired by a scanning electron microscope.

5. A pattern measuring method according to claim 1, wherein the reference position is set based on a pattern shape of the design data at the measuring point.

6. A pattern measuring method according to claim 5, wherein a distance is measured between the reference position and an outline of the pattern on the image.

7. A pattern measuring device comprising:
   a processor to measure a pattern on a specimen by comparing an image including a measurement pattern and the pattern on the specimen and design data of the pattern;
   wherein the processor executes a pattern matching algorithm which matches the reference pattern on the image with design data of the specimen, as the reference pattern on the image and a part of the design data corresponding to the reference pattern are superimposed; and
   measures a difference between the measurement pattern and a part of the design data corresponding to the measurement pattern based on the matched image.

8. A pattern measuring device according to claim 7, wherein the processor calculates, based on the design data, a distance between the reference pattern and the measuring point and a direction of the measuring point with respect to the reference pattern and sets, from the reference pattern on the image, the reference position for the measurement on the image of the pattern based on the calculated distance and direction.

9. A storage medium storing a computer-readable program for performing measurement of a pattern on an acquired image including a measurement pattern, the acquired image containing a pattern formed on a specimen;
   wherein the program executes a pattern matching algorithm which matches the reference pattern on the image with design data of the specimen, as the reference pattern on the image and a part of the design data corresponding to the reference pattern are superimposed; and
   measures a difference between the measurement pattern and a part of the design data corresponding to the measurement pattern based on the matched image.

* * * * *